United States Patent
Wang et al.

(10) Patent No.: US 12,320,593 B2
(45) Date of Patent: Jun. 3, 2025

(54) INTEGRATED VAPOR CHAMBER

(71) Applicant: TOP RANK TECHNOLOGY LIMITED, Apia (WS)

(72) Inventors: Tien-Lai Wang, Apia (WS); Tzu-Yu Wang, Apia (WS); Cheng-Yu Wang, Apia (WS); Meng-Yu Lee, Apia (WS)

(73) Assignee: TOP RANK TECHNOLOGY LIMITED, Apia (WS)

(*) Notice: Subject to any disclaimer, the term of this patent is extended or adjusted under 35 U.S.C. 154(b) by 252 days.

(21) Appl. No.: 18/134,755

(22) Filed: Apr. 14, 2023

(65) Prior Publication Data
US 2024/0240873 A1    Jul. 18, 2024

(30) Foreign Application Priority Data
Jan. 12, 2023    (TW) .................. 112101358

(51) Int. Cl.
F28D 15/04    (2006.01)
(52) U.S. Cl.
CPC .................. F28D 15/04 (2013.01)
(58) Field of Classification Search
CPC .... F28D 15/04; F28D 15/046; F28D 15/0233; H01L 23/427; H01L 23/473; H01L 23/3677; H01L 23/3736; H01L 23/4093; H05K 7/20309; H05K 7/2029; H05K 7/20318; H05K 7/20336; F28F 21/085
See application file for complete search history.

(56) References Cited

U.S. PATENT DOCUMENTS

| | | | |
|---|---|---|---|
| 2013/0126139 A1* | 5/2013 | Tsuruta | F28F 3/12 165/170 |
| 2014/0345832 A1* | 11/2014 | Lin | F28D 15/046 165/104.26 |
| 2017/0023307 A1* | 1/2017 | Wang | F28D 15/0233 |

FOREIGN PATENT DOCUMENTS

| | | | |
|---|---|---|---|
| CN | 115540661 A | * | 12/2022 |
| JP | 2020038051 A | * | 3/2020 |
| KR | 102501074 B1 | * | 2/2023 |
| TW | I395918 B | * | 5/2013 |

* cited by examiner

Primary Examiner — Tho V Duong
(74) Attorney, Agent, or Firm — WPAT, PC (57) ABSTRACT

An integrated vapor chamber includes a metallic top cover, a metallic bottom cover, a working space, capillary structures and a working fluid in the working space. The top cover includes oppositely an outer heat-dissipating surface and an inner condensation surface surrounded by a top frame. The inner condensation surface has parallel top grooves and protrusive supporting structures. The bottom cover includes oppositely an outer heat-absorption surface having recessed spaces for accommodating electronic elements and an inner evaporation surface surrounded by a bottom frame. The inner evaporation surface has parallel bottom grooves. The working space is an airtight space formed by engaging the top frame and the bottom frame with the inner condensation surface to face the inner evaporation surface, the top grooves to overlap individually the bottom grooves, the supporting structures to contact individually at the inner evaporation surface among the bottom grooves.

12 Claims, 9 Drawing Sheets

INTEGRATED VAPOR CHAMBER

CROSS REFERENCE TO RELATED APPLICATION

This application claims the benefits of Taiwan application Serial No. 112101358, filed on Jan. 12, 2023, the disclosures of which are incorporated by references herein in its entirety.

TECHNICAL FIELD

The present disclosure relates in general to a vapor chamber, and more particularly to an integrated vapor chamber.

BACKGROUND

High-power electronic elements are new-generation semiconductor components. With the popularity of 5G communication and artificial intelligence, servers of data centers are usually required to operate at higher frequencies and to provide more functional requirements. However, in order to meet high-speed communication and computation, the high-power electronic elements or chip processors are inevitably accompanied by a large amount of heat generated due to the high power density. If the accumulated heat in the electronic elements can't be dissipated effectively and immediately, the operational reliability of the electronic elements would be greatly affected, and thus the development of future application would be limited. Therefore, it is necessary to adopt a more efficient cooling system or module to accelerate heat removal and to ensure stable operation of the chips.

With the development of 5G communication, chiplet packaging is expected to become a new trend of advanced manufacturing processes in the future. Therefore, major international manufacturers such as Intel, TSMC, ASE, AMD, ARM, Microsoft and Qualcomm, have announced to establish an industry alliance named as a UCIe (Universal Chiplet Interconnect Express) to integrate multiple chiplets into a chiplet package so as to achieve a faster computing speed. It can be expected that, after the integration of multiple chiplets, the accumulated heats will be much more than ever. If the heat dissipation system can't keep up with the pace of the chiplet integration, the heat accumulated by the chiplets would be hard to be effectively removed. All these would lead to contribute the instability of the overall chip system. A common heat dissipation system applies a thermal paste to paste the heat-generating electronic elements, such as CPU and GPU, onto a heat-conducting metallic protective shell, such that the generated heat can be spread to the entire metallic protective shell. Then, a fin-type heat-dissipating device can be pasted on the metallic protective shell via the thermal paste, and a high-speed fan or a water cooling device can be adopted to enhance the heat dissipation of the heat-dissipating device. However, the computing speed of electronic elements is advancing at a rapid pace, and thus the aforesaid heat dissipation arrangement cannot effectively remove the huge amount of heat generated during the operation of electronic elements. Therefore, a new generation cooling module is introduced to plant an efficiency vapor chamber between the above-mentioned metallic protective shell and the heat-dissipating device, so as hopefully to remove the heat in a larger and more rapid scale.

As one of the advanced heat dissipation methods currently, the vapor chamber uses the phase change of a working fluid in a closed working chamber to dissipate heat rapidly. Through the latent heat transfer involved in the rapid vaporization and condensation process of the working liquid in the near-vacuum chamber (i.e., the closed working chamber), the purpose of rapid cooling can be achieved. Empirically, heat conduction efficiency of the vapor chamber can reach more than 10,000 $W/(m^{2.\circ} C.)$, namely dozens of times the heat conduction efficiency of a traditional air convection or liquid convection. In addition, the overall thickness of the vapor chamber can be lowered to around 3.0 mm, and so the vapor chamber can be widely applied in thin mobile devices and thin notebook computers.

However, when a large amount of heat is generated from the electronic elements, the heat is firstly conducted and dispersed to the metallic protective shell through the thermal paste, then the heat of the metal protective shell is further conducted to the vapor chamber through another thermal paste, and then the vapor chamber would dissipate the heat quickly. However, the heat dissipation efficiency of the thermal paste is far inferior to that of the metallic protective shell or the vapor chamber, and thus the thermal paste becomes the largest thermal resistance in the overall heat dissipation system, seriously reducing the heat dissipation efficiency of the vapor chamber. Furthermore, in order to be in close and smooth contact with the corresponding electronic element, so that the generated heat can be effectively transmitted to the metallic protective shell, materials used in the metallic protective shell are usually aluminum-magnesium alloys or other alloys with high hardness to avoid deformation. The softer material with higher thermal conductivity, such as pure copper, is seldom used as a material for the metallic protective shell. Hence, the shortcoming in the thermal resistance against overall cooling system is still yet to overcome. In order to improve the heat dissipation efficiency, in view of the aforesaid problems, a propose of this disclosure is to provide an integrated vapor chamber, which utilizes a cold-forged pure copper to provide high hardness to the vapor chamber, and reserves a heat-absorbing surface thereof as a recessed space to accommodate and directly contact the electronic elements. The original metallic protective shell and the vapor chamber are thus formed as a unique piece into the integrated vapor chamber by forging the same metal plate (or metal block). Thereupon, heterogeneous interfaces between the electronic elements and the vapor chamber would be eliminated, the associated thermal resistance therefrom would be removed, and thus the overall efficiency of the entire heat dissipation system would be improved.

The integrated vapor chamber provided in this disclosure can not only be applied to the heat dissipation of a single electronic element, but also to integrate multiple chiplet packages in response to future 5G communications, such that a multi-chip protective shell and a vapor chamber can be directly made as a unique piece. The vapor chamber can be in direct contact with the chip sets to enhance the heat conduction efficiency, and no need to apply the thermal paste as a medium. Namely, another purpose of this disclosure to provide superior heat dissipation efficiency to the multiple chips in a mobile device can be obtained.

In addition, the integrated vapor chamber disclosed in this disclosure adopts the cold-forging manufacturing method to process and shape the metal plate such as a copper, and then a CNC machining can be applied to finer modification. During the forging process, the metal does not need to be pre-heated and annealed, so internal grain structures of the forged metal will present no holes/voids and hypertrophy from the annealing, and thus the thermal conductivity thereof would be ensured. On the contrary, since the cold-forged metal needs no heating process, so the density of the internal grain structure thereof can be still maintained, and thus the forged metal can provide advantages of rigidity and improved compactness. After testing, thermal conductivity and thermal diffusivity of the forged metal can be further improved.

SUMMARY

In one embodiment of this disclosure, an integrated vapor chamber includes a metallic top cover, a metallic bottom cover, a working space, a vacuum channel, a plurality of capillary structures and a working fluid. The metallic top cover includes oppositely an outer heat-dissipating surface and an inner condensation surface. The inner condensation surface is surrounded by a top frame with a predetermined height, and the top frame is furnished with an upper communicative groove. The inner condensation surface has thereon a plurality of top grooves parallel to each other and a plurality of supporting structures protruding therefrom and disposed individually among the plurality of top grooves. The metallic bottom cover includes oppositely an outer heat-absorption surface and an inner evaporation surface. The outer heat-absorption surface has thereon at least one recessed space for accommodating at least one heat-generating element. The inner evaporation surface is surrounded by a bottom frame with another predetermined height, and the bottom frame is furnished with a lower communicative groove. The inner evaporation surface has thereon a plurality of bottom grooves parallel to each other. The working space is an airtight space formed by engaging the top frame of the metallic top cover and the bottom frame of the metallic bottom cover with the inner condensation surface of the metallic top cover to face the inner evaporation surface of the metallic bottom cover, the plurality of top grooves to overlap individually the plurality of bottom grooves, the plurality of supporting structures protruding from the inner condensation surface to contact individually at the inner evaporation surface among the plurality of bottom grooves. The vacuum channel is formed by connecting spatially the upper communicative groove and the lower communicative groove so as provide a channel for vacuuming the working space. The plurality of capillary structures are disposed individually inside the plurality of bottom grooves. The working fluid is in the working space and the plurality of capillary structures.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. In the following description and/or scope of patent application, the technical terms used should be interpreted with the usual meanings commonly used by those skilled in the art. For ease of understanding, the same elements in the following embodiments are referred to as the same symbols. In this specification, the term "about" usually means that the actual value is within plus or minus 10%, 5%, 1% or 0.5% of a specific value or range. The term "about" herein means also that the actual value falls within an acceptable standard error of the mean, as considered by one of ordinary skill in the art to which this invention pertains. Except for the examples, or unless otherwise expressly stated, it should be understood that ranges, amounts, values and percentages used herein are modified by "about". Therefore, unless otherwise stated, the numerical values or parameters disclosed in this specification and the appended patent claims are approximate numerical values and may be changed as required.

Figure 1:
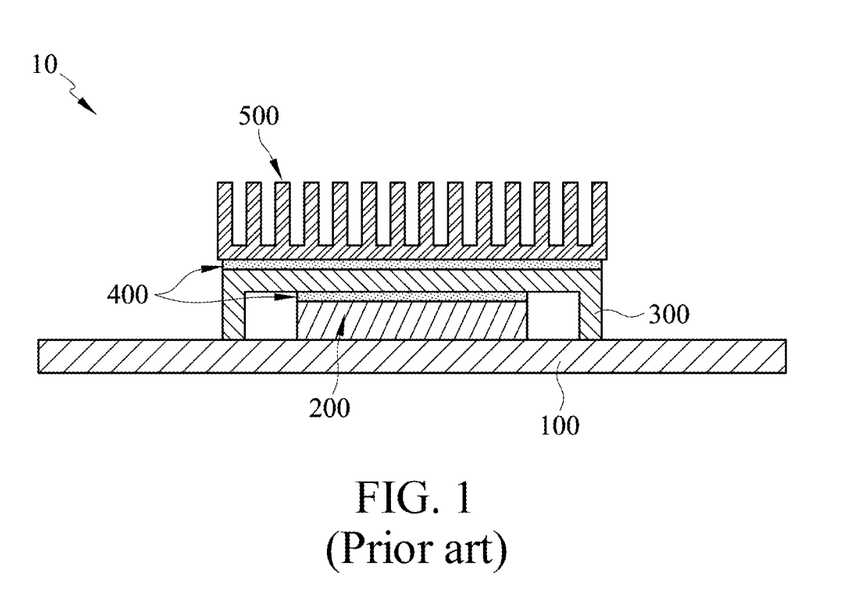
FIG. 1 to FIG. 3 show schematically different types of typical traditional heat-dissipating modules (prior arts)

Referring to FIG. 1, a traditional heat-dissipating module 10, generally applied to a CPU, a GPU and the like electronic element, includes a base plate 100, an electronic element 200, a metallic protective shell 300 and a heat-dissipating device 500. The heat-generating electronic element 200 is firstly pasted into the metallic protective shell 300 via the thermal paste 400, and then the heat-dissipating device 500 is pasted onto an outer surface of the metallic protective shell 300 via the thermal paste 400 for enhancing the heat dissipation.

Figure 2:
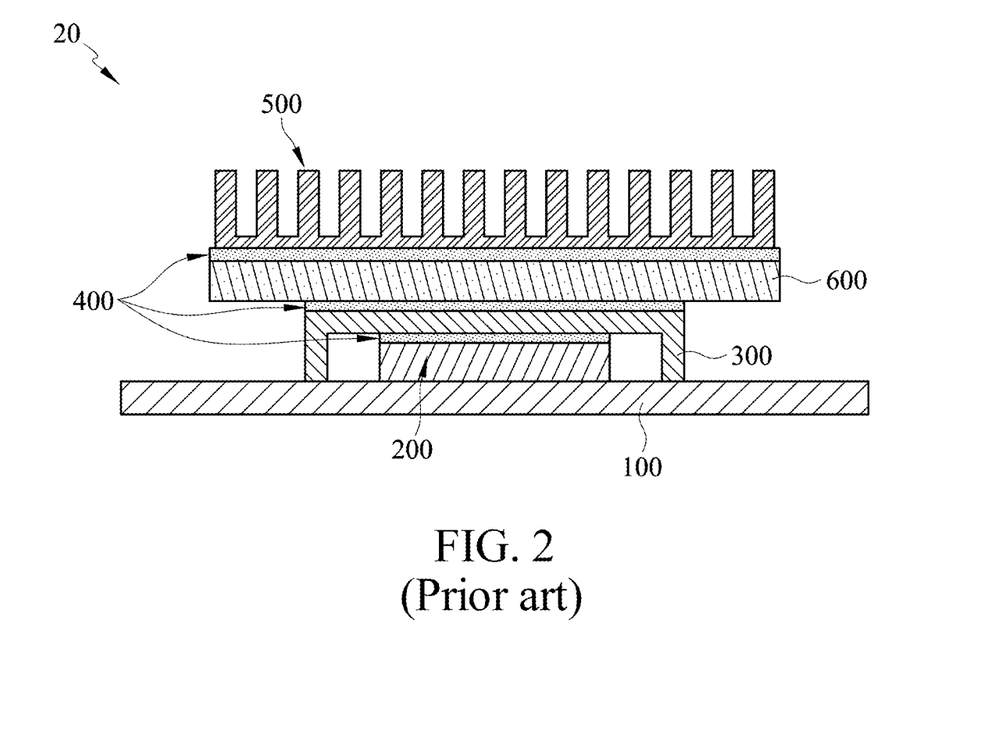

With the increase in computing ability of the electronic elements, the general traditional heat-dissipating modules have already been unable to provide sufficient heat dissipation. Thus, in order to further enhance the heat-dissipating capability, some new generation heat-dissipating modules have included the vapor chambers 600 for providing the heat-dissipating capability at least ten times higher than the traditional convectional heat-dissipating devices. In a typical design as shown in FIG. 2, a heat-dissipating module 20 is equipped with a vapor chamber 600 between the metallic protective shell 300 and the heat-dissipating device 500 of the aforesaid traditional heat-dissipating module. As noted, respective thermal pastes 400 are provided to firmly adhere the vapor chamber 600 to the metallic protective shell 300 and to the heat-dissipating device 500. However, in comparison to the traditional heat-dissipating modules, such a heat-dissipating module has one more layer of the thermal paste 400, which can provide only limited thermal conductivity. Apparently, this additional thermal paste 400 would endow additional heat resistance to the entire heat dissipation system.

Figure 3:
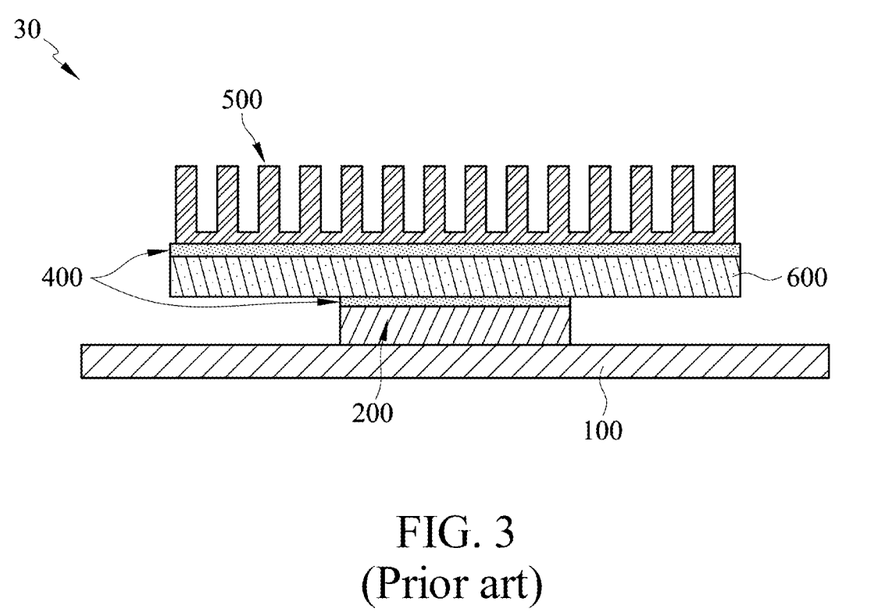

In order not to increase the heat resistance, referring to FIG. 3, another design of the heat-dissipating module 30 is to adhere the vapor chamber 600 directly onto the electronic element 200 via the thermal paste 400. When a heat is generated by the electronic element 200, the heat would be transferred to the vapor chamber 600 with higher heat-dissipating efficiency through the thermal paste 400. After the vapor chamber 600 absorbs the heat, the internal working fluid would be rapidly vaporized into steam. Since the heat-dissipating device 500 is disposed on the vapor chamber 600, thus the rising steam would hit a cooler surface of the heat-dissipating device 500, and then be condensed to release a huge amount of heat energy through the phase change. This released heat energy would be transmitted to the heat-dissipating device 500 through the thermal paste 400, and further be dissipated into the atmosphere through air convection. Since the vapor chamber 600 usually has a thickness of about 3 mm, and the vapor chamber 600 made of soft material such as pure copper would deform or distort to loose the tightness between the electronic element 200 and the vapor chamber 600 after a long-term use, thus the entire heat resistance would increase to fail an effective heat transfer. In view of the foregoing situation, this disclosure provides an improved vapor chamber made by cold-forging, providing an accommodating space at the heat-absorbing surface of the lower cover for mounting electronic elements. Such an improved vapor chamber would present a higher heat-dissipating efficiency by providing high hardness, anti-deformation and a space for accommodating at least one electronic element 200.

Figure 4:
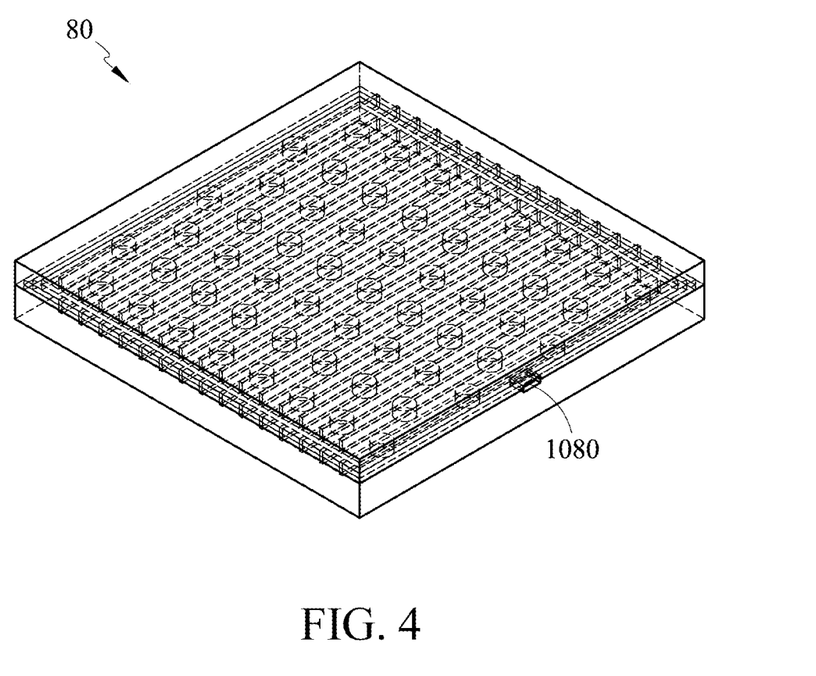
FIG. 4 and FIGS. 5A-5B show schematically an embodiment of the integrated vapor chamber in accordance with this disclosure.
Figure 5A:
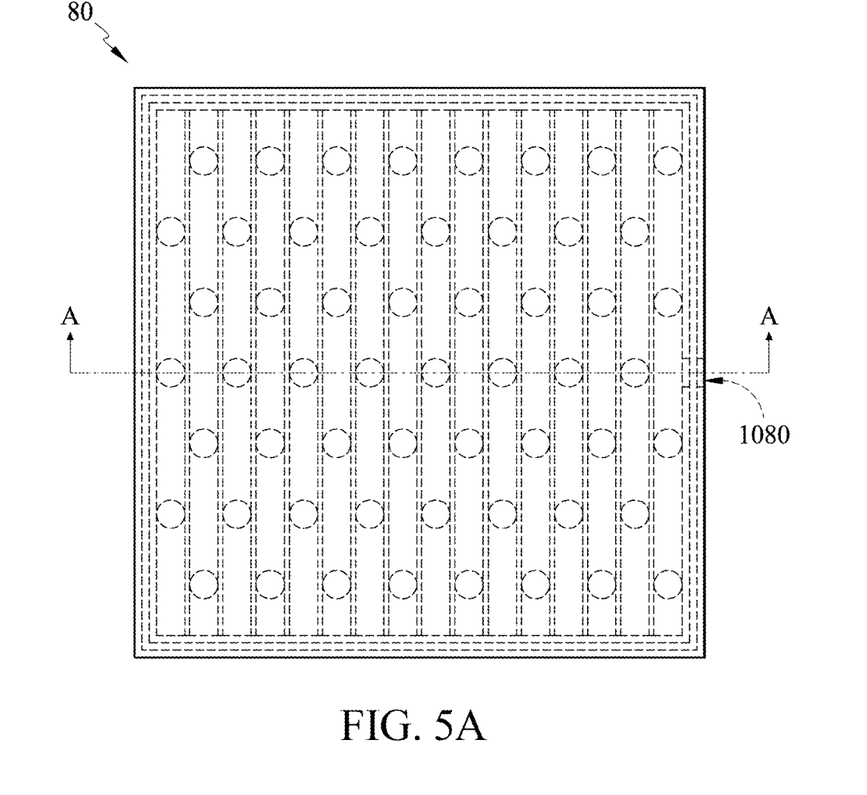
Figure 5B:
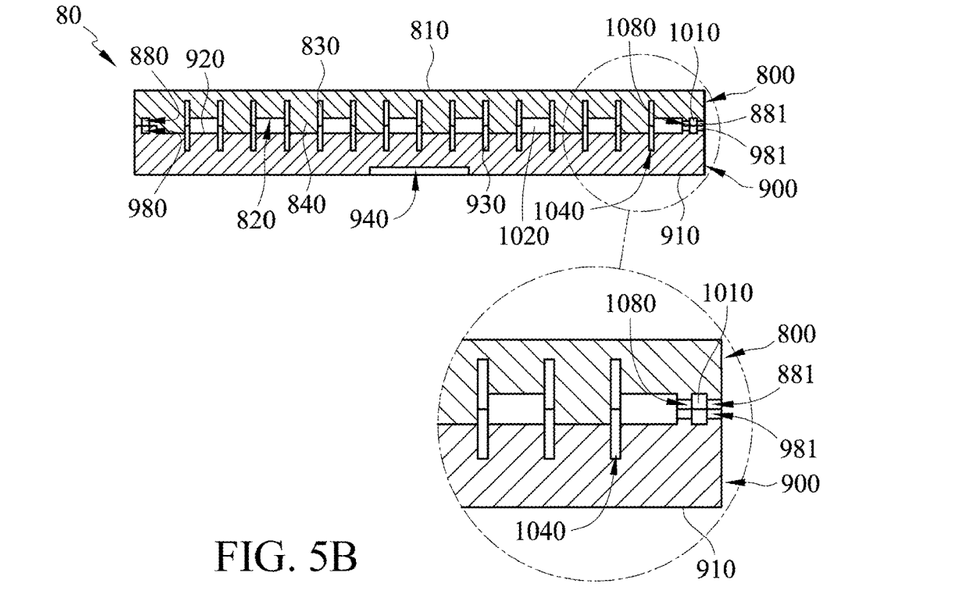

Referring to FIG. 4 and FIGS. 5A-5B, an embodiment of an integrated vapor chamber 80 in accordance with this disclosure includes at least a metallic top cover 800, a metallic bottom cover 900, a working space 1020, a vacuum channel 1080, a plurality of capillary structures 1040 and a working fluid. The metallic top cover 800 further includes an outer heat-dissipating surface 810, an inner condensation surface 820 and a top frame 880. The top frame 880 provides a relevant height to surround thereinside the inner condensation surface 820. The top frame 880 is furnished thereof with an upper communicative groove 881. The inner condensation surface 820 has thereon a plurality of top grooves 830 parallel to each other and a plurality of supporting structures 840 disposed individually between two neighboring top grooves 830 by protruding over the top grooves 830. The metallic bottom cover 900 further includes oppositely an outer heat-absorption surface 910 and an inner evaporation surface 920. The outer heat-absorption surface 910 has at least one recessed space 940 for accommodating heat-generating elements. The inner evaporation surface 920 is surrounded by a bottom frame 980 with a relevant height. The bottom frame 980 is furnished thereof with a lower communicative groove 981. The inner evaporation surface 920 has thereon a plurality of bottom grooves 930 parallel to each other. The working space 1020 is an airtight space formed by tightly engaging the top frame 880 of the metallic top cover 800 and the bottom frame 980 of the metallic bottom cover 900. In particular, the inner condensation surface 820 of the metallic top cover 800 is arranged to match the inner evaporation surface 920 of the metallic bottom cover 900 by overlapping each of the top grooves 830 onto one corresponding bottom groove 930. The plurality of supporting structures 840 are protruded from the inner condensation surface 820 to individually contact the inner evaporation surface 920 within corresponding spacing among the bottom grooves 930, such that the working space 1020 can be stably spanned. The vacuum channel 1080 is formed by connecting spatially the upper communicative groove 881 and the lower communicative groove 981 so as to provide a channel for vacuuming the working space 1020. The capillary structures 1040 are disposed inside the bottom grooves 930. The working fluid is provided to the working space 1020 and the capillary structures 1040. In one embodiment, the top frame 880 and the bottom frame 980 of the integrated vapor chamber 80 further include individual welding grooves 1010 for accepting welding to connect the metallic top cover 800 and the metallic bottom cover 900 so as for forming the vapor chamber 80.

Figure 6A:
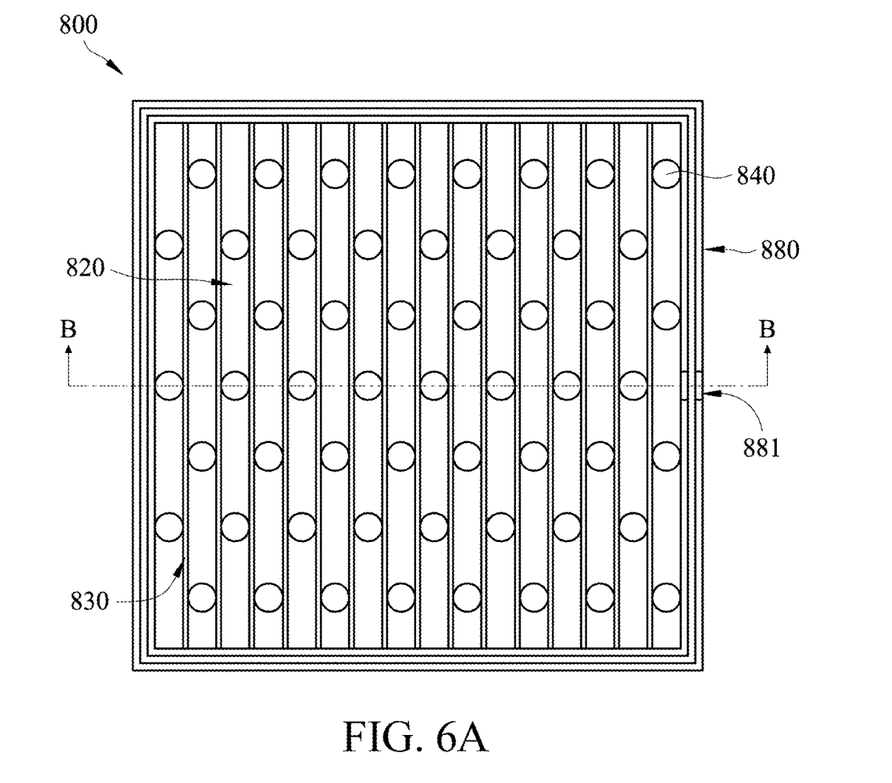
FIGS. 6A-6B show schematically a metallic top cover of an embodiment of the integrated vapor chamber in accordance with this disclosure.
Figure 6B:
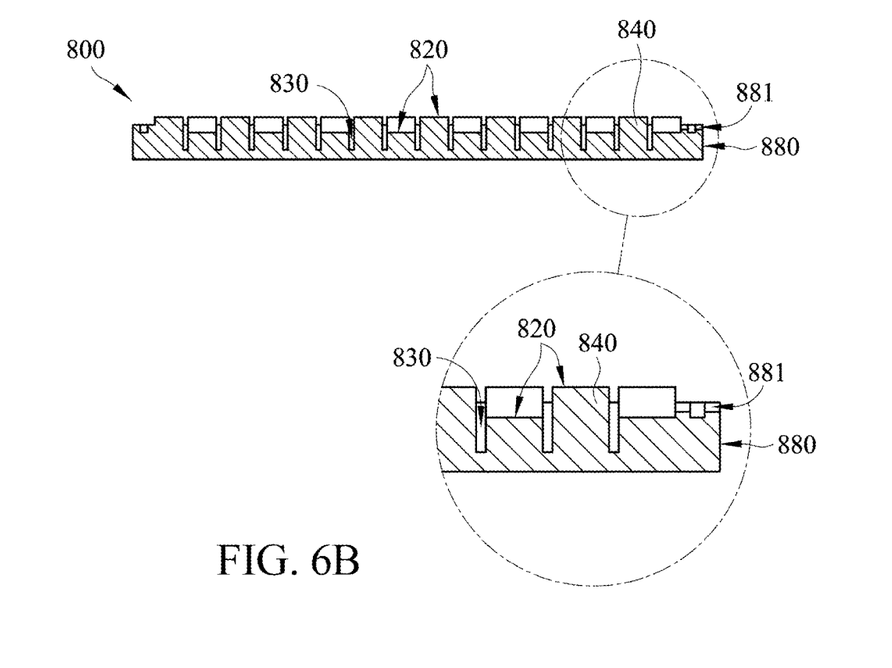

Referring to FIGS. 6A-6B, the metallic top cover 800 for the integrated vapor chamber is schematically shown. In this embodiment, the integrated vapor chamber is characterized in which the conformation and structure features of the metallic top cover are directly formed on the same piece of metal by cold-forging. For example, the supporting structures are all directly formed, as a unique piece, from the same metal body by cold-forging, not by re-sintering or welding. Namely, all the different structures of the entire metallic top cover are directly formed from the same metal as a unique piece by forging. Certainly, a CNC machining can be applied for finer modification. Further, in this embodiment, the plurality of supporting structures 840 on the inner condensation surface 820 of the metallic top cover 800 for the integrated vapor chamber are directly formed on the inner condensation surface 820 by cold-forging. In other words, the supporting structures 840 are not separable with respect to the inner condensation surface 820 of the metallic top cover 800, and also not foreign parts to be sintered or welded to the inner condensation surface 820 of the metallic top cover 800.

Figure 7A:
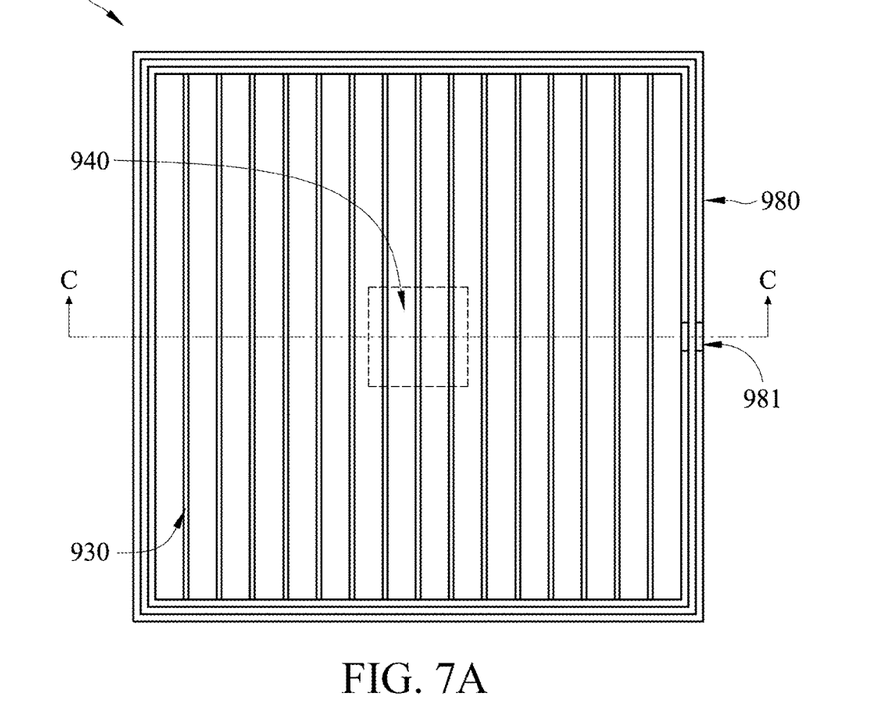
FIGS. 7A-7B show schematically a metallic bottom cover of an embodiment of the integrated vapor chamber in accordance with this disclosure.
Figure 7B:
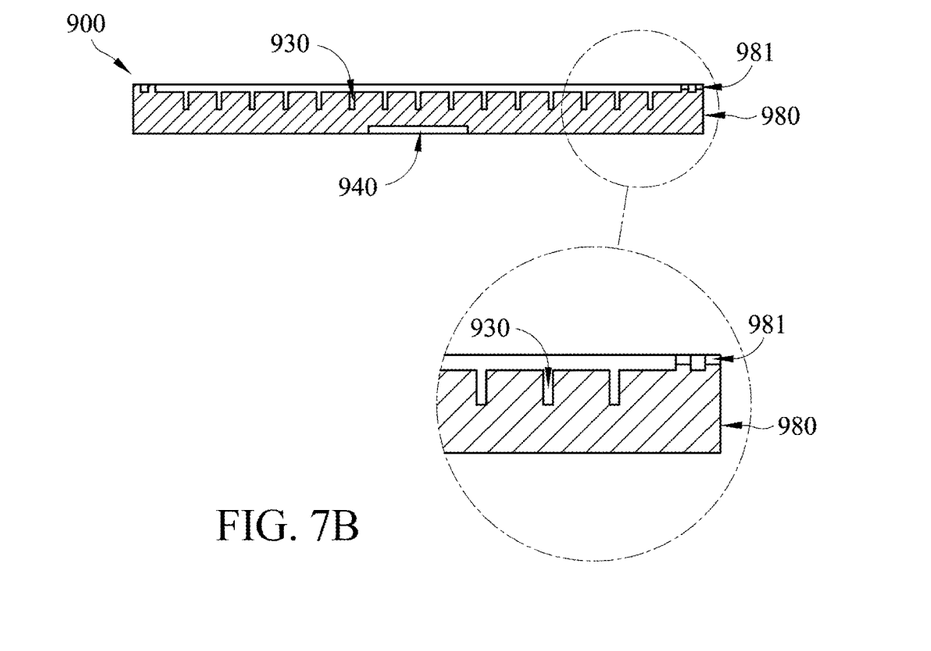

Referring to FIGS. 7A-7B, the metallic bottom cover 900 for the integrated vapor chamber is schematically shown. In this embodiment, the integrated vapor chamber is characterized in that the conformation and structure features of the metallic bottom cover are directly formed on the same piece of metal by cold-forging. For example, all the different structures of the entire metallic bottom cover 900, including the recessed space 940 of the outer heat-absorption surface 910, are directly formed from the same metal as a unique piece by cold-forging. Certainly, a CNC machining can be applied for finer modification. In addition, the recessed space 940 on the outer heat-absorption surface 910 of the cold-forged metallic bottom cover 900 is a concave structure with respect a direction from the outer heat-absorption surface 910 to the inner evaporation surface 920, and the inner evaporation surface 920 does not demonstrate a corresponding convex structure. Contrary to a traditional pressing process, a concave structure at one side is always accompanied with a convex structure at another side.

Generally speaking, in producing the one-piece metallic top or bottom cover of the aforesaid integrated vapor chamber, an etching process or a combined machining process (for example, integrating a pressing process and a milling process) can be used, following with the sintering process. The advantage of etching is that the workpiece can be processed to have complicated structures, and thus the etching process is generally applicable to a task that a traditional process can't work on. On the other hand, the advantage of the combined machining process is that all the involved steps can be achieved by mature arts, and no additional development work is required. Nevertheless, the etching process spends a prolong process time, and usually needs a secondary process to finish a possible unsmooth surface. On the other hand, the combined machining process needs both the labors and the time.

According to this disclosure, a cold-forging process is applied to manufacture the metallic top cover 800 or the metallic bottom cover 900 of the integrated vapor chamber. In comparison to the etching process or the combined machining process, the cold-forging process is firstly to place a metal piece (or a metal block) into a female mode. Then, under the room temperature, a male mode is applied to repeatedly forge the metal within the female mode to form a final product. It shall be understood to the skilled in the art that the cold-forging process requires no preheating and annealing steps of a typical forging or pressing process, thus the thermal conductivity of the forged metal would not be reduced since the internal grain structure of the forged metal would not exist holes/voids and hypertrophy caused by the annealing. The cold-forged metal undergoes no heating process, thus the internal grain structure would maintain a quite dense situation, the holes or voids inside the forged metal can be greatly reduced, and the surface of the forged metal would be much smoother. Thereupon, additional thermal resistance caused by ill contacts between the electronic element and the metal can be significantly reduced. In addition, rigidity and compactness of the forged metal would be further increased to reject possible deformation or distortion. After testing, the thermal conductivity and thermal diffusivity of the forged metal are higher than those of the un-forged metal. Namely, the integrated vapor chamber in accordance with this disclosure can provide better heat-dissipating efficiency than that produced by the general traditional process.

In the embodiment of the integrated vapor chamber according to this disclosure, the material for the metallic top cover 800 and the metallic bottom cover 900 is a metallic material with superior thermal conductivity and thermal diffusivity, such as pure copper, and, after the cold-forging process, the corresponding one-piece structure can be formed.

In one exemplary example, the material for producing the metallic top cover 800 and the metallic bottom cover 900 of the integrated vapor chamber is the pure copper with high thermal conductivity and thermal diffusivity. The cold-forged metallic top cover 800 and metallic bottom cover 900 would present the Vickers hardness within 90 HV~120 HV; for example, about 95 HV~120 HV, 100 HV~120 HV, 105 HV~120 HV, 110 HV~120 HV, 115 HV~120 HV, and preferably 115 HV~117 HV.

In another exemplary example, the material for producing the metallic top cover 800 and the metallic bottom cover 900 of the integrated vapor chamber is the pure copper with high thermal conductivity and thermal diffusivity. The cold-forged metallic top cover 800 and metallic bottom cover 900 would present the thermal conductivity within 400 W/(m·K) ~430 W/(m·K); for example, about 405 W/(m·K)~430 W/(m·K), 410 W/(m·K)~430 W/(m·K), and preferably 420 W/(m·K)~430 W/(m·K).

In a further exemplary example, the material for producing the metallic top cover 800 and the metallic bottom cover 900 of the integrated vapor chamber is the pure copper with high thermal conductivity and thermal diffusivity. The cold-forged metallic top cover 800 and metallic bottom cover 900 would present the thermal diffusivity within 90 mm²/sec~120 m²/sec; for example, about 95 mm²/sec~120 mm²/sec, 100 mm²/sec~120 mm²/sec, 105 mm²/sec~120 mm²/sec, 110 mm²/sec~120 mm²/sec, 115 mm²/sec~120 mm²/sec, and preferably 115 mm²/sec~117 mm²/sec.

To the skilled in the art, he or she should understand that the aforesaid ranges of Vickers hardness, thermal conductivity and thermal diffusivity can be only achieved by the cold-forged pure copper, not by any material provided through any other processing method. In any of the aforesaid examples, the metallic top cover 800 and the metallic bottom cover 900 of the integrated vapor chamber are made of pure copper, and manufactured by the cold-forging process. After having a third party (the YUANHE company) to test Vickers hardness, thermal conductivity and thermal diffusivity of the cold-forged metal, the results are listed in Table 1 as follows, in comparison to results by the traditional combined machining process such as a process having pressing and CNC machining steps.

TABLE 1

|  | Cold-forging | Traditional combined machining |
| --- | --- | --- |
| Vickers hardness (HV) | 115~117 | 85~87 |
| Thermal conductivity (W/m · K) | about 430 | about 395 |
| Thermal diffusivity (mm²/sec) | 115~117 | 85~87 |

From Table 1, any skilled person in the art would understand clearly that the cold-forged integrated vapor chamber provided in this disclosure can present better thermal dissipation properties than the product produced by the traditional combined machining process. However, it shall be understood as well that these excellent thermal properties can be only obtained through repeated forging on the metal material in the cold-forging process. In particular, the more the time and forcing of the forging are, the higher the thermal property would be. Thus, after the cold forging process, the aforesaid thermal dissipation properties would be superior to those provided by the traditional machining method.

Figure 8A:
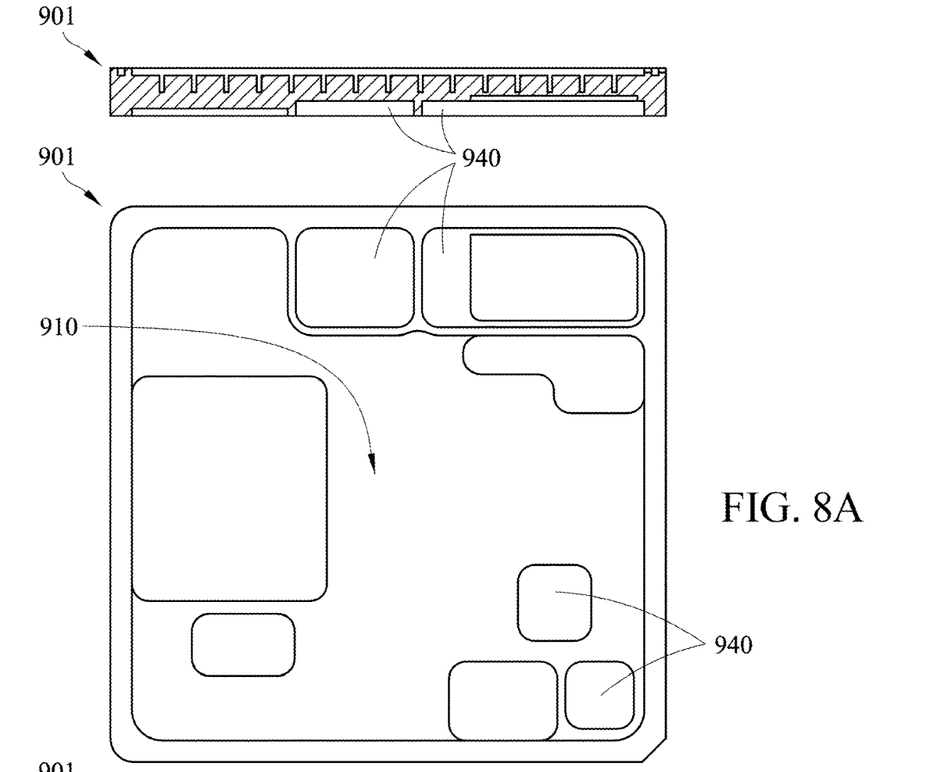
FIGS. 8A-8B show schematically a metallic bottom cover of another embodiment of the integrated vapor chamber in accordance with this disclosure.
Figure 8B:
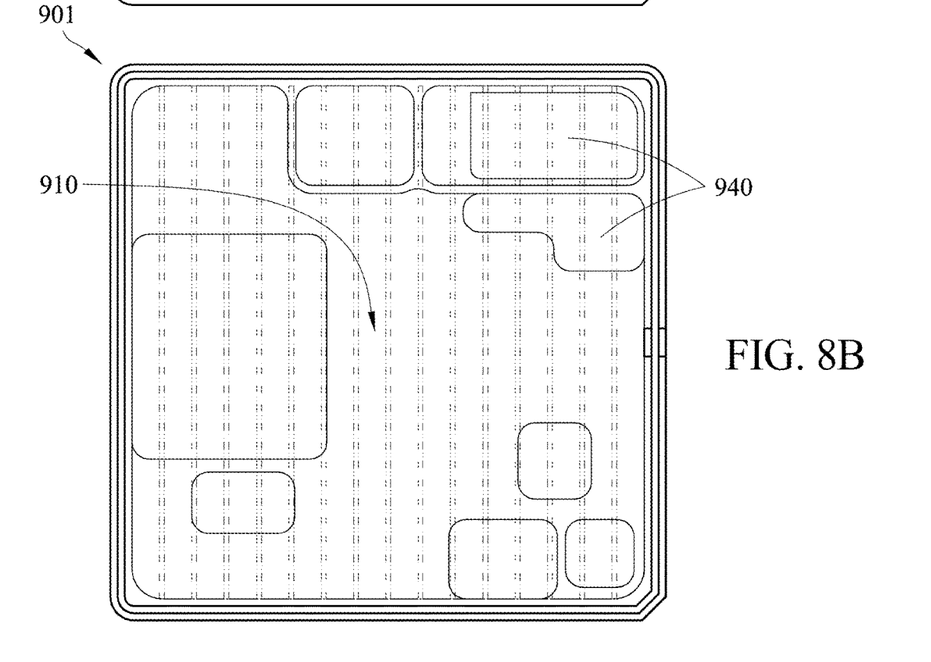
Figure 9:
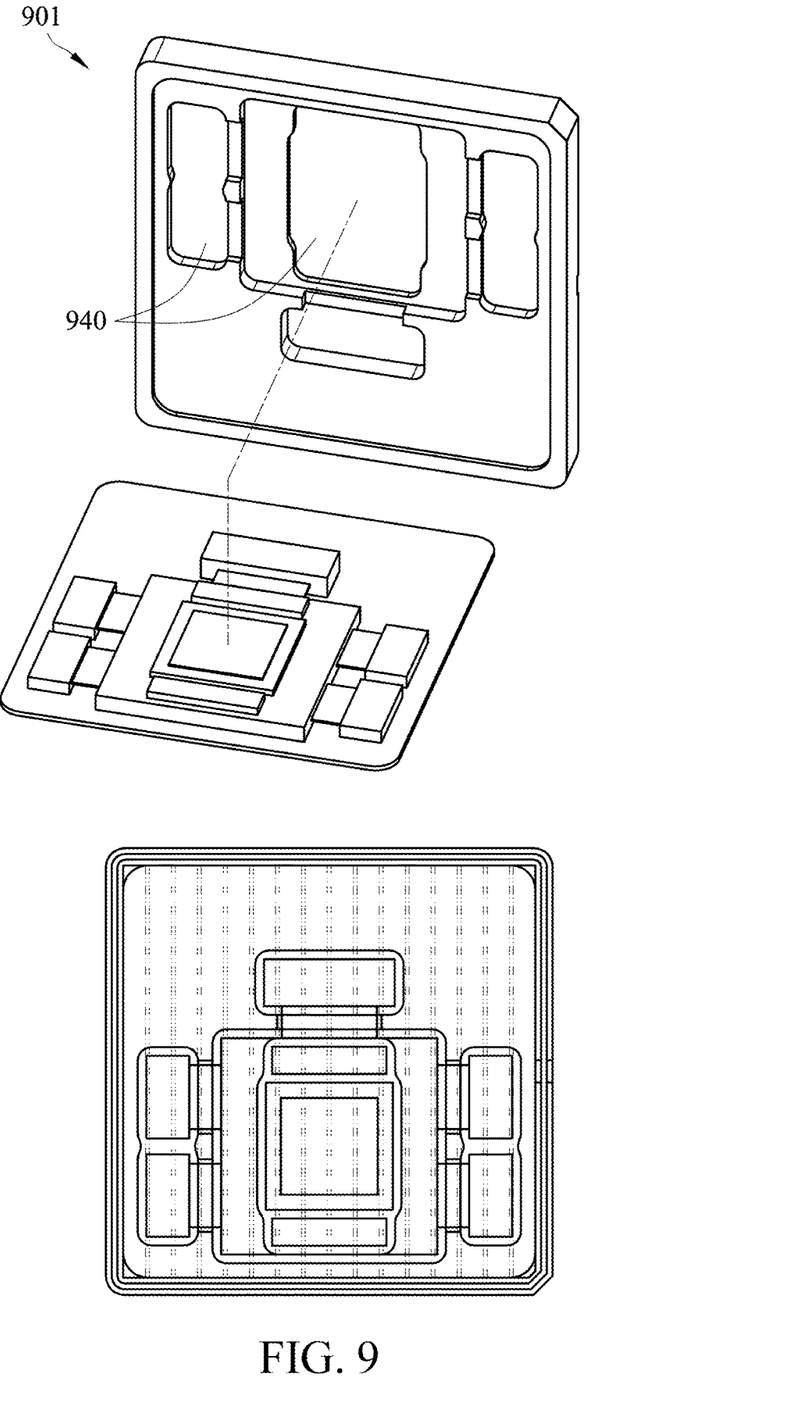
FIG. 9 shows schematically another exemplary example of the metallic bottom cover of FIGS. 8A-8B.

Referring to FIGS. 8A-8B, another exemplary example of the metallic bottom cover 901 for the integrated vapor chamber of this disclosure is schematically shown. The outer heat-absorption surface 910 of the metallic bottom cover 901 further includes a plurality of recessed spaces 940, and each of the recessed spaces 940 is a concave structure on the outer heat-absorption surface 910, without a corresponding convex structure on the inner evaporation surface 920. The recessed spaces 940 are used for accommodating individually a plurality of electronic elements. Referring to FIG. 9, a further exemplary example of the metallic bottom cover 901 for the integrated vapor chamber of this disclosure is schematically shown. In this example, the plurality of recessed spaces 940 have identical or different shapes and volumes. In accordance with the sizes and shapes of the individual chiplets of the chip sets on the circuit board, a plurality of recessed spaces 940 to contain simultaneously electronic elements with different sizes, shapes or volumes can be manufactured in a customized way. For example, the integrated vapor chamber as shown in FIG. 8A can be designed to accommodate a chipset of 5G server. When external electronic elements are accommodated into the respective recessed spaces 940 on the outer heat-absorption surface 910, conductive materials with superior conductivity can be further added to be sandwiched individually between the electronic elements and the outer heat-absorption surface 910, such that the thermal resistance caused by uneven contact surfaces can be reduced. For example, the aforesaid conductive materials can include thermal pastes or graphite flakes. With these interfacing conductive materials, contact between each of the electronic elements and the outer heat-absorption surface 910 can be perfect to enhance the heat-dissipating efficiency. It shall be understood that, in any embodiment of the integrated vapor chamber, the metallic bottom cover 900 or 901 is made to be a unique piece by the cold forging process. In one embodiment, the pure copper with high thermal diffusivity and thermal conductivity is used to produce the one-piece structure by the cold-forging process. Thereupon, the metallic bottom cover formed by the forged pure copper would present the hardness and rigidity superior to that by a traditional process, and thus is uneasy to be deformed or distorted.

In one embodiment of the integrated vapor chamber according to this disclosure, each of the plurality of the supporting structure can be a post.

In one embodiment of the integrated vapor chamber according to this disclosure, the working fluid can be pure water.

In one embodiment of the integrated vapor chamber according to this disclosure, an air pressure of the working space can be less than $1 \times 10^{-3}$ torr, $1 \times 10^{-4}$ torr, or $1 \times 10^{-5}$ torr.

Certainly, each of the above-mentioned embodiments is only for illustration and not limiting the scope of the present disclosure, and any equivalent modification or change made according to the integrated vapor chamber of the above-mentioned embodiments shall still be included in the patent scope of the present disclosure.

It is worth mentioning that most of the existing heat dissipation modules would add a metal protective shell between the vapor chamber and the electronic component. The main reason is to pursue thinner electronic products. Currently, the thickness of the vapor chamber is only about 3 mm, and most of the vapor chambers are made of pure copper with better heat conduction but softer material. In order to avoid deformation under high temperature for a long time to further affect the heat dissipation efficiency, the traditional metal protective shell is usually made of aluminum-magnesium alloy with higher rigidity but poor thermal conductivity than the pure copper. In addition, the traditional metal protective shell needs to transfer heat to the vapor chamber for heat dissipation, through a thermal paste. Compared with the integrated vapor chamber disclosed in this disclosure, the metallic bottom cover is directly made to replace the metal protective shell, such that the thermal resistance between the aluminum-magnesium alloy and the thermal paste can be eliminated. Thus, the heat dissipation module in accordance with the present disclosure would have better heat dissipation efficiency than that of a traditional design. In addition, compared with other general traditional processing methods, the cold-forging process can not only endow the material with a finer grain structure, but also reduce internal defects such as holes/voids, so that the material can obtain higher strength, deformation resistance and fatigue resistance. Also, the thermal conductivity and thermal diffusion efficiency of the material can be improved. Thereupon, the resulted integrated vapor chamber would be superior to general heat dissipation modules with similar structures in terms of heat dissipation efficiency, durability and reliability.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. An integrated vapor chamber, comprising:
   a metallic top cover, including oppositely an outer heat-dissipating surface and an inner condensation surface, the inner condensation surface being surrounded by a top frame with a predetermined height, the top frame being furnished with an upper communicative groove, the inner condensation surface having thereon a plurality of top grooves parallel to each other and a plurality of supporting structures protruding therefrom and disposed individually among the plurality of top grooves;
   a metallic bottom cover, including oppositely an outer heat-absorption surface and an inner evaporation surface, the outer heat-absorption surface having thereon at least one recessed space for accommodating at least one electronic element, the inner evaporation surface being surrounded by a bottom frame with another predetermined height, the bottom frame being furnished with a lower communicative groove, the inner evaporation surface having thereon a plurality of bottom grooves parallel to each other;
   a working space, being an airtight space formed by engaging the top frame of the metallic top cover and the bottom frame of the metallic bottom cover with the inner condensation surface of the metallic top cover to face the inner evaporation surface of the metallic bottom cover, the plurality of top grooves to overlap individually the plurality of bottom grooves, the plurality of supporting structures protruding from the inner condensation surface to contact individually at the inner evaporation surface among the plurality of bottom grooves;
   a plurality of capillary structures, disposed individually inside the plurality of bottom grooves; and
   a working fluid, in the working space and the plurality of capillary structures.

2. The integrated vapor chamber of claim 1, wherein the metallic top cover and the plurality of supporting structures are made as a unique piece from a metal by a cold-forging process, and the metallic bottom cover is also made as a unique piece from another metal by the cold-forging process.

3. The integrated vapor chamber of claim 2, wherein the metal is pure copper, and each of the metallic top cover and the metallic bottom cover has Vickers hardness of about 90 HV~120 HV.

4. The integrated vapor chamber of claim 2, wherein the metal is pure copper, and each of the metallic top cover and the metallic bottom cover has thermal conductivity of about 400 W/(m·K)~430 W/(m·K).

5. The integrated vapor chamber of claim 2, wherein the metal is pure copper, and each of the metallic top cover and the metallic bottom cover has thermal diffusivity of about 90 mm$^2$/sec~120 mm$^2$/sec.

6. The integrated vapor chamber of claim 2, wherein each of the plurality of supporting structures is a post.

7. The integrated vapor chamber of claim 2, wherein the outer heat-absorption surface has thereon a plurality of the recessed spaces for accommodating individually a plurality of electronic elements.

8. The integrated vapor chamber of claim 7, wherein the plurality of the recessed spaces have identical or different shapes and volumes to accommodate individually and simultaneously the plurality of electronic elements with identical or different shapes and volumes.

9. The integrated vapor chamber of claim 2, wherein the at least one recessed space is concave on the outer heat-absorption surface, without a corresponding convex structure on the inner evaporation surface.

10. The integrated vapor chamber of claim 2, wherein the metallic top cover and the metallic bottom cover are engaged firmly by welding.

11. The integrated vapor chamber of claim 2, wherein the working fluid is pure water.

12. The integrated vapor chamber of claim 2, wherein an air pressure of the working space is less than $1\times10^{-3}$ torr.

* * * * *